United States Patent [19]
Lee

[11] Patent Number: 5,933,749
[45] Date of Patent: Aug. 3, 1999

[54] METHOD FOR REMOVING A TOP CORNER OF A TRENCH

[75] Inventor: Tzung-Han Lee, Taipei, Taiwan

[73] Assignee: United Microelectronics Corp., Taiwan

[21] Appl. No.: 09/000,964

[22] Filed: Dec. 30, 1997

[30] Foreign Application Priority Data

Oct. 27, 1997 [TW] Taiwan ................................ 86115836

[51] Int. Cl.[6] .................................................. H01L 21/76
[52] U.S. Cl. ......................... 438/435; 438/424; 438/437; 438/978; 148/DIG. 50
[58] Field of Search ..................... 438/424, 427, 438/430, 435, 437, 978; 148/DIG. 50

[56] References Cited

U.S. PATENT DOCUMENTS

| | | | |
|---|---|---|---|
| 4,882,291 | 11/1989 | Jeuch | 438/424 |
| 4,889,928 | 12/1989 | Jeuch | 438/426 |
| 5,801,083 | 9/1998 | Yu et al. | 148/DIG. 50 |
| 5,880,004 | 3/1999 | Ho | 438/424 |

*Primary Examiner*—Trung Dang
*Attorney, Agent, or Firm*—Rabin & Champagne, P.C

[57] ABSTRACT

A method for removing the top corner of the trench is disclosed. After the formation of an oxide layer and then a nitride layer over a substrate, a portion of the nitride layer, the oxide layer and the substrate are removed to form a trench. A mask is next formed on the nitride layer, wherein the opening of the mask is larger than the corresponding trench. A dry etching is performed to etch the exposed nitride layer and the substrate, using said mask. After removing the mask and the nitride layer, a liner oxide layer is then formed. The dry etching process removes the top corner to form a grading corner which consequently avoids charge accumulation and point discharging.

11 Claims, 3 Drawing Sheets

METHOD FOR REMOVING A TOP CORNER OF A TRENCH

BACKGROUND OF THE INVENTION

1. Field of the Invention

The invention relates in general to the fabrication of a trench, and more particularly to a method for removing top corner through an additional dry etching process after the formation of trenches.

2. Description of the Related Art

Trench structure has been widely applied for the isolation technique of integrated circuit (IC) fabrication. For example, it is utilized in the isolation technique for dynamic random access memory (DRAM) to have smaller isolation size than the conventional isolation technique of local oxidation. Trench structure is also applied in the structure of the storage capacitor of DRAM. Typically, the technique of etching a trench includes using some particular gas mixture, in corporation with precise control of the hardware.

Dry etching is one of the most common methods of forming a trench. Using plasma but not solution for film etching is characterized by anisotropic etch, which provides much larger vertical etch rate than the horizontal one. It prevents the phenomenon of undercut. The trench structure formed by dry etching includes a straight sidewall and a top corner with a substantially right angle.

FIG. 1A to FIG. 1C show the cross-sectional views of forming a conventional trench. Referring first to FIG. 1A, an oxide layer 11 is first formed in the substrate 10 and then a silicon nitride layer 12 is formed on the oxide layer 11. A photoresist layer is added on the silicon nitride layer 12 for the further process of the anisotropic dry etching. After several trenched 13 are formed, the photoresist layer on the silicon nitride layer is then removed. Referring to FIG. 1B, after forming the trench 13 and removing the silicon nitride layer 12 and the oxide layer 11, an liner oxide layer 14 is grown on the surface of the substrate 10 and the trench 13. Silicon oxide 15 is then filled in the trench 13. The afteretched top corner has an angle of about 90°, which causes charge accumulation and leakage current. During the following processes, the metal conductive layer may contact with the top corner, as shown in FIG. 1C. The metal conductive layer 16 may at least bestraddle the substrate 10 and the trench 13. If there is an existence of another structure 17 on the substrate, the metal conductive layer may further bestraddle the structure 17 and the trench 13. The bestaddling of the metal conductive layer and the leakage current due to charge accumulation together result in short circuit, which therefore reduces the reliability and the productivity. It is then called Kink effect.

SUMMARY OF THE INVENTION

It is therefore an object of the invention to provide a method of removing the top corner of the trench to grade the turning point so that the leakage current and short circuit due to charge accumulation can be improved.

A method of removing a top corner of a trench is provide. A substrate having an oxide layer, a silicon nitride layer and a number of trenches are formed thereon. A mask on the silicon nitride layer is formed, wherein the mask at least has an opening over each of the corresponding trenches, and the opening of the mask is wider than an opening of each of the corresponding trenches. An anisotropic etching process is performed to remove the portion of each of the exposed silicon nitride, oxide layer and substrate. The mask is removed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
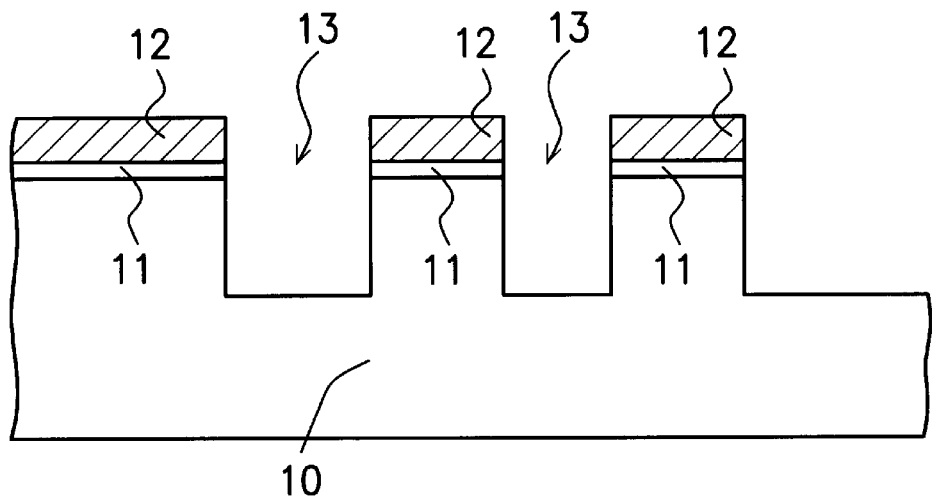
FIGS. 1A to 1C are cross-sectional views showing a conventional process flow of fabricating trenches.
Figure 1B:
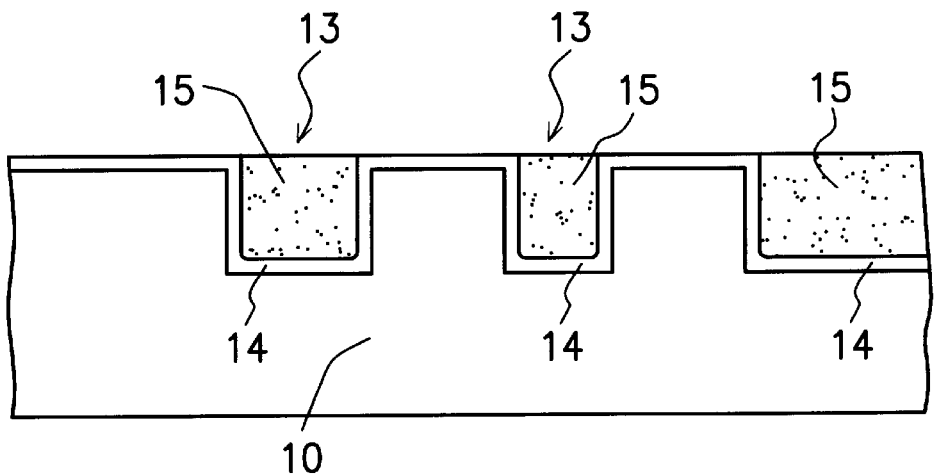
Figure 1C:
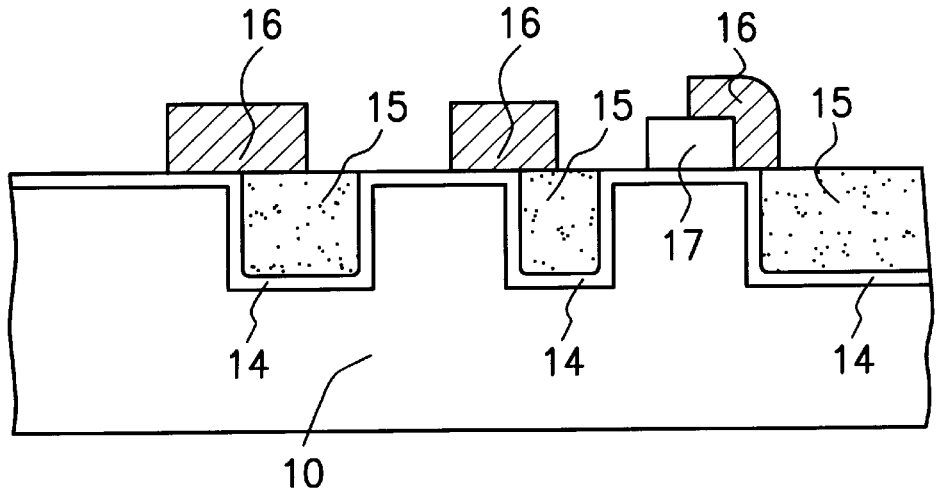
Figure 2A:
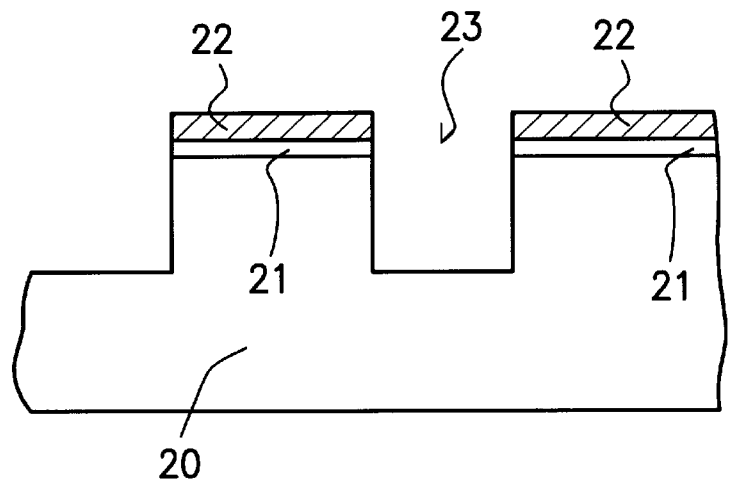
FIGS. 2A to 2D are cross-sectional views showing the method of removing the top corner of trenches according to a preferred embodiment of the invention.
Figure 2B:
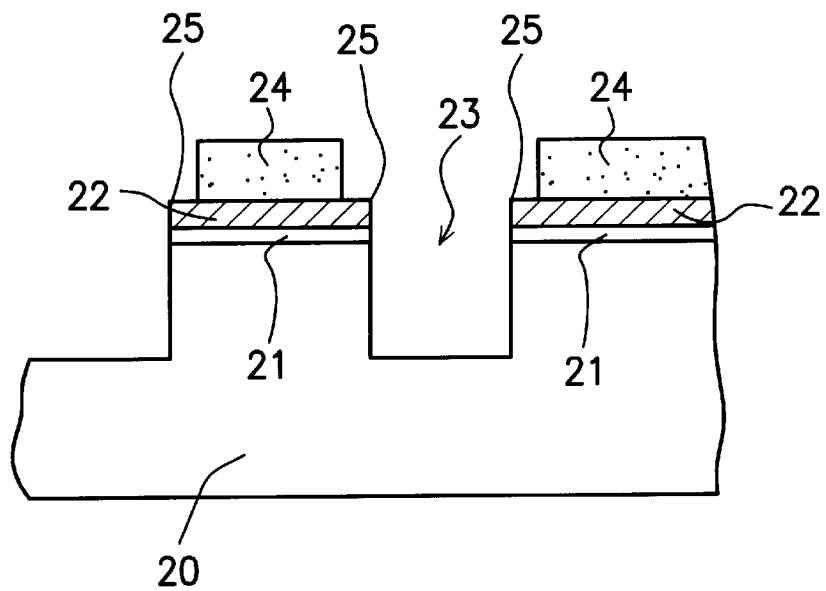
Figure 2C:
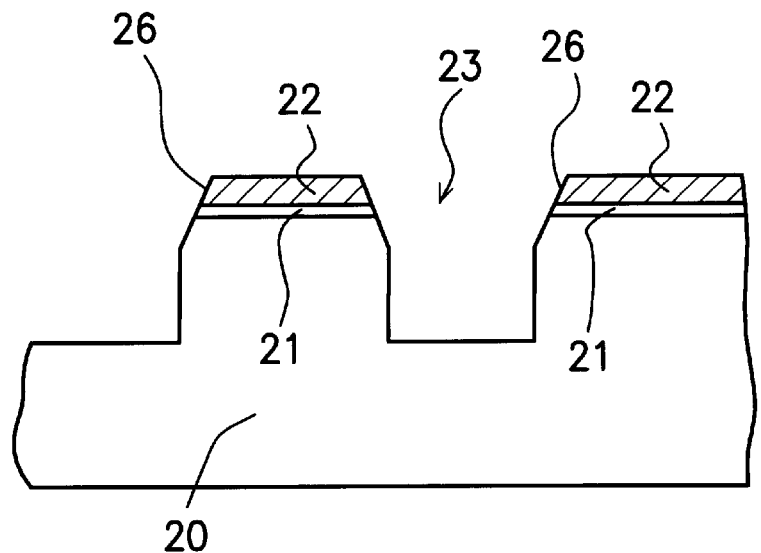

Referring first to FIG. 2A, an oxide layer 21 is formed over the substrate 20, wherein the composition of the substrate includes, for example, silicon. Next, a silicon nitride layer 22 is formed on the oxide layer 21 and then a photoresist layer is added on the silicon nitride layer 22. Using the patterned photoresist layer as a mask, at least a portion of the substrate 20, the oxide layer 21 and the silicon nitride layer 22 are etched to form trenches. After the removal of the photoresist layer, the corner 25 that the silicon nitride layer 22 and the trench 23 crosses forms a right angle. Charge accumulation and leakage current tend to occur at the right-angle top corner 25. To avoid charge accumulation and leakage current, a further mask 24, such as a photoresist layer, is formed onto the silicon nitride layer 22, having a structure as shown in FIG. 2B. The openings of the mask 24 are wider than the openings of the respective trenches 23 preferably for about 1.1 times. An isotropic dry etching is then performed to remove at least a portion of each of the silicon nitride layer 22, and at least a portion of each of the substrate uncovered by the mask 24. The uncovered silicon nitride layer 22 and the substrate 20 in the trench 23 are both exposed in the reactive plasma. The etching rate and selectivity are adjusted by the composition of the plasma. The polymers, as a by-product of the reaction, usually adhere to the surface of the trenches 23. The adhered polymers will effect the etching rate and the configuration of the trenches 23. The original right-angle top corner 25 will be etched away and the exposed oxide layer 21 and the substrate 20 will also be partially removed to form a grading corner, as shown in FIG. 2C. As the dry etching process is ended, the mask 24 is then removed; therefore a grading corner 26 is shown up.

Figure 2D:
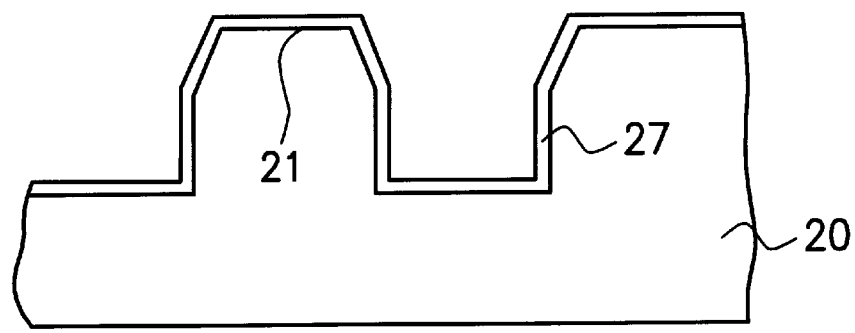

Next, referring to FIG. 2D, the silicon nitride layer 22 is removed. The liner oxide layer 27 is formed in the trench 23. Further more, back end processes are performed.

The right-angle top corner at the trench tends to accumulate charges and thus results in point discharge. This invention includes an extra etching step, using a mask with wider openings than that of the trenches. The corner is exposed in the reactive plasma to remove the sharp corner. The liner oxide layer is then formed to avoid charge accumulation and leakage current so that the reliability and the productivity are improved.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of removing a top corner of a trench, comprising the steps of:

providing a substrate, wherein the substrate has an oxide layer, a silicon nitride layer and a plurality of trenches formed thereon;

forming a mask on the silicon nitride layer, wherein the mask at least has an opening over each of the corresponding trenches, and the opening of the mask is wider than an opening of each of the corresponding trenches so that a portion of each of the silicon nitride, the oxide layer and the substrate are exposed;

performing an anisotropic etching process to remove the portion of each of the exposed silicon nitride, oxide layer and substrate; and removing the mask.

2. A method of removing a top corner of a trench as claimed in claim 1, wherein a process of forming the trenches further comprises the steps of:

forming the oxide layer on the substrate;

forming the silicon nitride layer on the oxide layer;

forming a photoresist layer on the oxide layer;

removing a portion of each of the oxide layer, the silicon nitride layer and the substrate, using the photoresist layer as a mask, to form the trenches; and removing the photo resist layer.

3. A method of removing a top corner of a trench as claimed in claim 1, wherein the mask includes a photoresist layer.

4. A method of removing a top corner of a trench as claimed in claim 1, the opening of the mask is wider than the opening of each of the corresponding trenches for about 1.1 times.

5. A method of removing a top corner of a trench as claimed in claim 1, wherein the anisotropic etching is dry etching.

6. A method of removing a top corner of a trench as claimed in claim 1, wherein the substrate is a silicon substrate.

7. A method of removing a top corner of a trench, comprising the steps of:

providing a substrate, wherein the substrate has an oxide layer, a silicon nitride layer and a plurality of trenches formed thereon;

forming a photoresist layer on the silicon nitride layer, wherein the photoresist layer at least has an opening over each of the corresponding trenches, and the opening of the photoresist layer is wider than an opening of each of the corresponding trenches so that a portion of each of the silicon nitride, the oxide layer and the substrate are exposed;

performing an anisotropic etching process to remove the portion of each of the exposed silicon nitride, oxide layer and substrate; and removing the photoresist layer.

8. A method of removing a top corner of a trench as claimed in claim 7, wherein a process of forming the trenches further comprises the steps of:

forming the oxide layer on the substrate;

forming the silicon nitride layer on the oxide layer;

forming a photoresist layer on the oxide layer;

removing a portion of each of the oxide layer, the silicon nitride layer and the substrate, using the photoresist layer as a mask, to form the trenches; and removing the photo resist layer.

9. A method of removing a top corner of a trench as claimed in claim 7, the opening of the mask is wider than the opening of each of the corresponding trenches for about 1.1 times.

10. A method of removing a top corner of a trench as claimed in claim 7, wherein the anisotropic etching is dry etching.

11. A method of removing a top corner of a trench as claimed in claim 7, wherein the substrate is a silicon substrate.

* * * * *